United States Patent
Ohtsuka et al.

(10) Patent No.: US 6,463,839 B2
(45) Date of Patent: Oct. 15, 2002

(54) PUNCH HOLDER APPARATUS

(75) Inventors: Yasuyuki Ohtsuka; Shigeru Endo, both of Kanagawa (JP)

(73) Assignee: Amada Company, Limited, Kanagawa (JP)

( * ) Notice: Subject to any disclaimer, the term of this patent is extended or adjusted under 35 U.S.C. 154(b) by 0 days.

(21) Appl. No.: 09/364,063

(22) Filed: Jul. 30, 1999

(65) Prior Publication Data

US 2002/0007714 A1 Jan. 24, 2002

(51) Int. Cl.⁷ .................................................. B26F 1/14
(52) U.S. Cl. ...................................... 83/698.91; 83/686
(58) Field of Search ............................. 83/698.91, 684, 83/686, 698.31, 698.71, 698.61, 698.11, 699.51, 699.61

(56) References Cited

U.S. PATENT DOCUMENTS

| | | | | |
|---|---|---|---|---|
| 1,910,296 A | * | 5/1933 | King .......................... | 83/698.91 |
| 2,107,581 A | * | 2/1938 | Parsons et al. ............. | 83/698.91 |
| 2,136,190 A |   | 11/1938 | Gulfelt | |
| 2,217,560 A | * | 10/1940 | Michon ....................... | 83/684 |
| 2,420,146 A | * | 5/1947 | Mueller ...................... | 83/698.91 |
| 3,245,694 A | * | 4/1966 | Parker ....................... | 83/698.91 |
| 3,640,170 A | * | 2/1972 | Bennett ..................... | 83/698.91 |
| 3,721,154 A | * | 3/1973 | Leibinger et al. .......... | 83/698.91 |
| 4,332,179 A | * | 6/1982 | Wallis ........................ | 83/698.91 |
| 4,375,774 A | * | 3/1983 | Wilson et al. ............. | 83/698.91 |
| 4,377,100 A | * | 3/1983 | Wallis ........................ | 83/698.91 |
| 4,558,620 A | * | 12/1985 | Wallis ........................ | 83/691 |
| 4,604,931 A | * | 8/1986 | Bastian et al. ............. | 83/665 |
| 4,726,270 A | * | 2/1988 | Lucas ........................ | 83/698.91 |
| 5,181,438 A | * | 1/1993 | Wellman .................... | 83/698.91 |
| 5,197,368 A | * | 3/1993 | Meyer et al. ............... | 83/698.91 |
| 5,410,932 A | * | 5/1995 | Moellering ................. | 83/698.91 |
| 5,419,225 A | * | 5/1995 | Fujita ........................ | 83/698.91 |
| 5,839,183 A | * | 11/1998 | Powlett ...................... | 29/464 |
| 5,860,315 A | * | 1/1999 | Sawdon ..................... | 83/698.91 |
| 5,992,285 A | * | 11/1999 | Talarico ..................... | 83/698.91 |
| 6,276,247 B1 | * | 8/2001 | Helda ......................... | 83/684 |

FOREIGN PATENT DOCUMENTS

| | | | | |
|---|---|---|---|---|
| DE | 4334417 A1 | * | 4/1994 | ................. 83/684 |
| GB | SU1780900 A1 | * | 12/1992 | ................. 83/684 |
| JP | 53-027184 | | 3/1978 | |
| JP | 406226372 A | * | 8/1994 | ................. 83/684 |

* cited by examiner

Primary Examiner—Kenneth E. Peterson
Assistant Examiner—Omar Flores Sánchez
(74) Attorney, Agent, or Firm—Blank Rome Comisky & McCauley LLP

(57) ABSTRACT

A punch holder apparatus includes: a punch holder formed with a punch mounting hole and with an inspection hole in a direction perpendicular to a longitudinal direction of the punch holder; an engagement piece to be mounted in the inspection hole; a lock piece formed with a receiving allowable concave section to receive the engagement piece; and pressurizing means for pressurizing the lock piece so that an engagement piece pushing-out holding section provided to the lock piece is normally located in a position corresponding to the engagement piece. In the above construction, the lock piece is provided so as to be capable of moving in a direction parallel to the longitudinal direction of the punch holder. Furthermore, the receiving allowable concave section receives the engagement piece which is moved in the direction perpendicular to the longitudinal direction of the punch holder.

2 Claims, 4 Drawing Sheets

PUNCH HOLDER APPARATUS

BACKGROUND OF THE INVENTION

1. Field of the Invention

The present invention relates to a punch holder apparatus which a punch chip is mounted to and is used for a punching process.

2. Description of Relevant Art

In the relevant art, a conventional punch holder apparatus of a burring tools contains a lot of members including a punch chip. When a thickness of a workpiece to be burred is changed by changing to another material workpiece, manually changing operation of the punch chip is required. Therefore, since the punch holder apparatus of a burring tools contains a lot of members and the structure of the punch holder apparatus is complex, the manually changing operation of the punch chip is very tedious and hard.

SUMMARY OF THE INVENTION

The present invention has been achieved with such points in view. It therefore is an object of the present invention to provide a punch holder apparatus where a punch chip can be changed so as to be mounted to and removed from a punch holder with one step and one action.

A first aspect of the present invention provides a punch holder apparatus, comprising: a punch holder formed with a punch mounting hole in a longitudinal direction of the punch holder, the punch holder further formed with an inspection hole in a direction perpendicular to the longitudinal direction of the punch holder; an engagement piece to be mounted in the inspection hole, the engagement piece being able to move in the inspection hole so as to locate on an inner circumferential surface of the punch mounting hole; a lock piece formed with a receiving allowable concave section to receive the engagement piece, the lock piece being provided so as to be capable of moving in a direction parallel to the longitudinal direction of the punch holder, the receiving allowable concave section receiving the engagement piece which is moved in the direction perpendicular to the longitudinal direction of the punch holder; and pressurizing means for pressurizing the lock piece so that an engagement piece pushing-out holding section provided to the lock piece is normally located in a position corresponding to the engagement piece.

Therefore, in order to mount a punch chip to the punch mounting hole formed in the punch holder, when the lock piece is pushed from a downward side, for example, the lock piece moves upward, for example, against an applied force of the pressurizing means, and the engagement piece pushing-out holding section provided to the lock piece slips out of the engagement piece. Then, the receiving allowable concave section comes to a position corresponding to the engagement piece so that the engagement piece is fitted into the receiving allowable concave section, and the punch chip is inserted into the punch holder. After the insertion, when the state that the lock piece is pushed is released, the engagement piece pushing-out holding section moves to the position to the engagement piece by means of the applied force of the pressurizing means so as to pressurize or press the engagement piece, and the punch chip is engaged with the punch holder.

In the case where the punch chip is removed from the punch mounting hole, when the lock piece is pushed from a downward side, for example, the lock piece moves upward, for example, against the applied force of the pressurizing means so that the engagement piece pushing-out holding section slips out of the engagement piece. In this state the punch chip is pulled, for example so that the punch chip comes out of the punch holder.

In such a manner, the punch chip is easily mounted to and removed from the punch mounting hole of the punch holder with one step.

A second aspect of the invention, as it depends from the first aspect, provides a punch holder apparatus wherein the inspection hole from which the state of the engagement piece can be checked in such a manner that the inspection hole opens to an outer circumferential surface of the punch holder.

Therefore, since the punch holder has the inspection hole, the state of the engagement piece can be easily checked from the inspection hole.

A third aspect of the invention, as it depends from the first aspect or the second aspect, provides a punch holder apparatus wherein the lock piece has a stopper section which always stops in a constant position so that the engagement piece is automatically fitted into the receiving allowable concave section.

Therefore, since the stopper section is provided to the lock piece, the stopper section always stops in a constant position, and the engagement piece is automatically fitted into the receiving allowable concave section.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1:
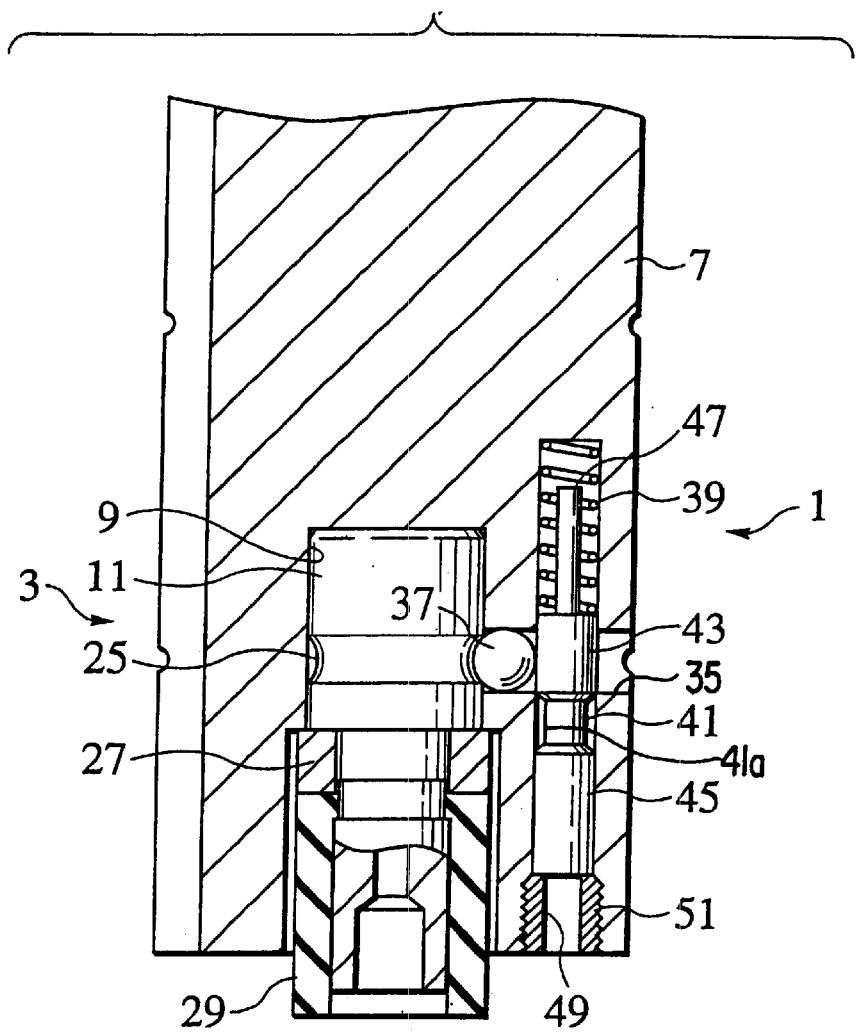
FIG. 1 is a front sectional view of a punch tool showing an upper tool and a lower tool provided with a punch holder apparatus according to a second embodiment of the present invention.
Figure 1:
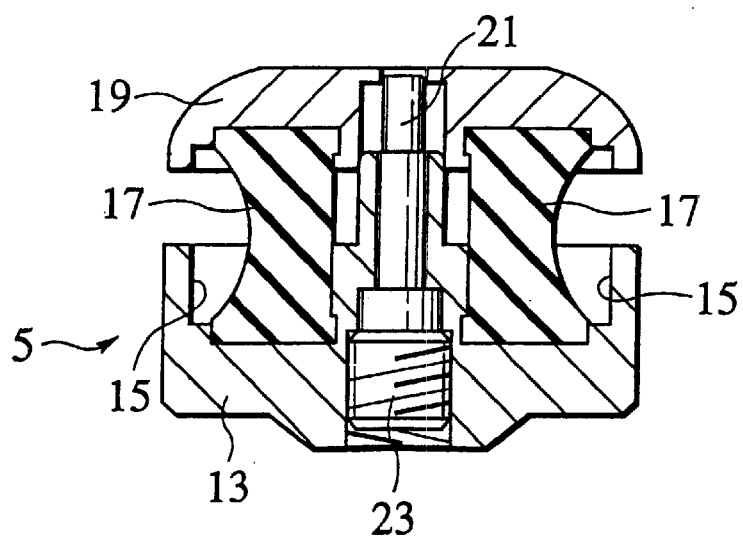

There will be detailed below the preferred embodiments of the present invention with reference to the accompanying drawings. Like members are designated by like reference characters.

Figure 7:
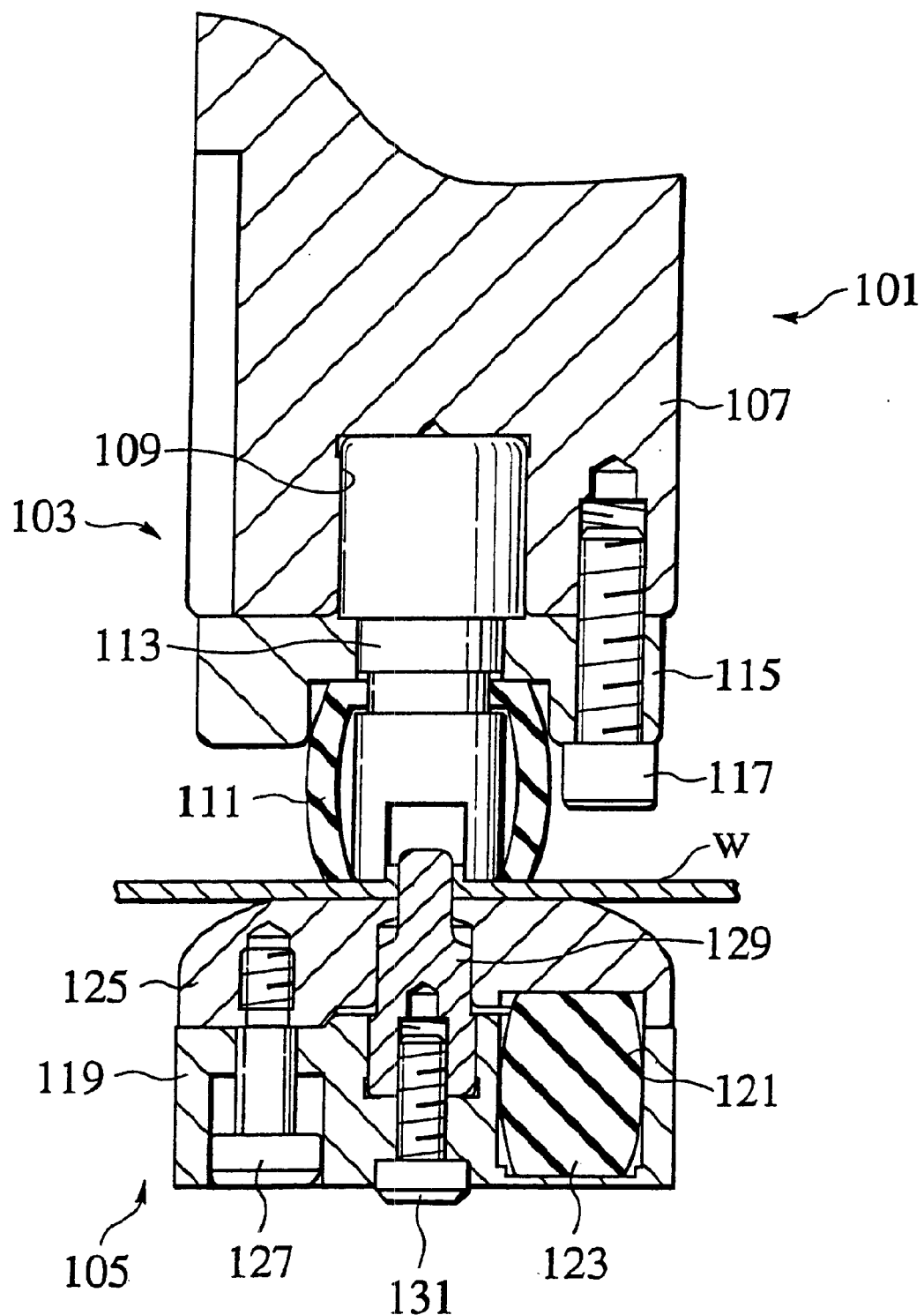
FIG. 7 is a front sectional view of a burring tool showing an upper tool and a lower tool according to a first embodiment.

As shown in FIG. 7, a punch holder apparatus for a burring tool 101 to burr a workpiece upward according to a first embodiment has an upper tool 103 and a lower tool 105. The upper tool 103 has a punch holder 107 which is extended in a up-and-down direction, and a punch mounting hole 109 is formed at a forward end (lower end) of the punch holder 107.

In a state that a punch chip 113 having urethane rubber 111 is mounted to a punch supporting member 115 from a lower side, an upper portion of the punch chip 113 is mounted to the punch mounting hole 109 and is fixed by a plurality of bolts 117 with the punch supporting member 115 being brought into contact with the lower end of the punch holder 107.

Meanwhile, the lower tool 105 has a die base 119, and in a state that urethane rubber 123 is mounted into a groove 121 formed in the die base 119, an ejector 125 is provided on the die base 119 so as to be mounted to the die base 119 by a through bolt 127 from the lower side. Furthermore, an ejector pin 129 is mounted from an upper side to an approximately center portion of the die base 119 and the ejector 125. The ejector pin 129 is mounted to the die base 119 by a bolt 131.

According to the above structure, a work W is placed on the ejector 125 and the punch tool 103 is lowered to the die tool 105 so that the urethane rubber 111 pressurizes the work W. Moreover, the urethane rubber 121 is deflected and the ejector 125 descends so that the ejector pin 129 is projected from the ejector 125. As a result, the work W is subject to upward burring process by co-operation of the punch chip 113 and the ejector pin 129.

In this connection, in the above-mentioned punch tool 103 according to the first embodiment, since the punch chip 113 is fixed to the punch holder 107 by the plural bolts 117 via the punch supporting member 115, in order to remove and mount the punch chip 113 from/to the punch holder 107, the bolts 117 should be loosened and tightened. As a result, the punch chip can be changed so as to be mounted to and removed from a punch holder with small amount actions.

There will be detailed below a second embodiment of the present invention where the first embodiment is modified with reference to FIGS. 1 through 6. Especially the object of the second embodiment is to provide a punch holder apparatus where a punch chip can be changed so as to be mounted to and removed from a punch holder with one step, one action or one shot.

As shown in FIG. 1, a burring tool 1, for example, has an upper tool 3 and a lower tool 5. The upper tool 3 has a punch holder 7 which is extended in an up-and-down direction, and a punch mounting hole 9 is formed at a forward end (lower end) of the punch holder 7. A punch chip 11 is mounted to and removed from the punch mounting hole 9 with one step.

Meanwhile, the lower tool 5 has a die base 13, and a plurality of grooves 15 are formed in the die base 13. Urethane rubber 17 is fitted into the grooves 15 with a force being applied to the urethane rubber 17 upward. An ejector 19 is provided on the urethane rubber 17. An ejector pin 21 is mounted to an approximately center portion of the ejector 19 and the die base 13 and is fitted into the die base 13 by a screw 23 provided on a lower end portion of the ejector pin 21.

According to the above structure, a work, for example, is placed on the ejector 19 and the punch holder 7 is lowered. Then, the work is subject to an upward burring process by co-operation of the punch chip 11 and the ejector pin 21.

Figure 2:
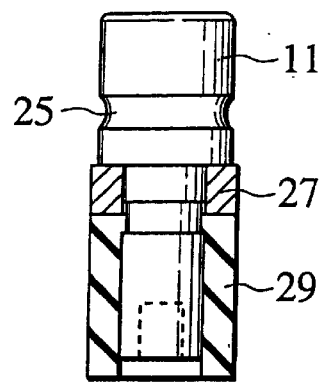
FIG. 2 is a front sectional view of a punch chip.

As shown in detail in FIG. 2, an R-shaped groove 25 is formed on an outer circumference of the punch chip 11, and a collar 27 and urethane rubber 29 are provided on an outer circumference of a lower portion of the punch chip 11.

Figure 3:
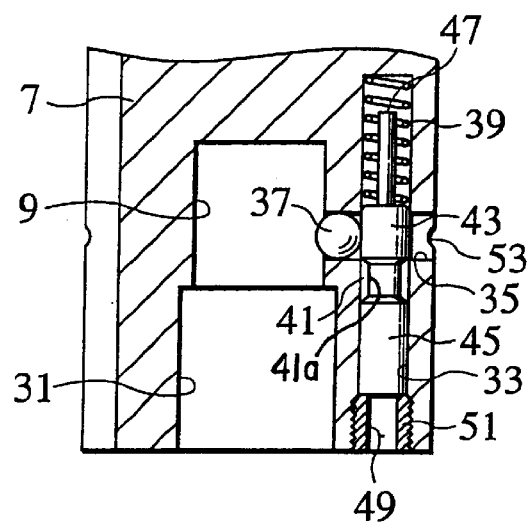
FIG. 3 is a front sectional view of a punch holder.
Figure 4:
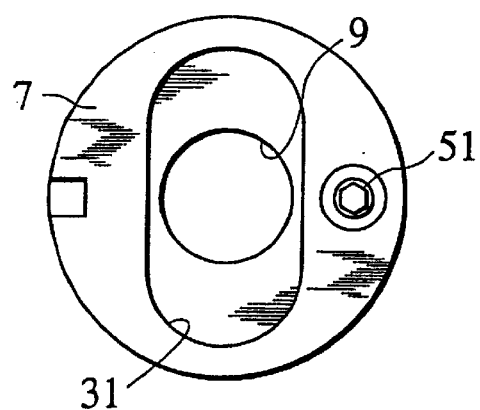
FIG. 4 is a bottom view of FIG. 3.

As shown in FIGS. 3 and 4, a hole 31 into which a finger of an operator can be inserted is formed at a lower portion of the punch mounting hole 9 so as to be interconnected therewith in the punch holder 7. A hole 33 which is extended in an up-and-down direction is formed on a right portion of the punch holder 7 in FIG. 3, and a hole 35, which pierces through in a direction intersecting perpendicularly to the hole 33 (right-and-left direction in FIG. 3), is formed. A left end of the hole 35 in FIG. 3 is interconnected with the punch mounting hole 9.

A steel ball 37 as one example of an engagement piece is fitted into the hole 35. Moreover, a spring 39 as one example of pressurizing means is mounted to an upper portion in the hole 33, and a pin 45 as one example as a lock piece, which has a receiving allowable concave section 41 forming a circumferential recess 41a for the steel ball 37 and an engagement piece pushing-out holding section 43, is mounted into the hole 33. Furthermore, a forward end (upper end) of the pin 45 has a stopper section 47. Moreover, a set screw 51 where a hole 49 pierces through its center portion is fitted into a lower end of the hole 33 so that the pin 45 does not slip outside. A forward end (right end) of the hole 35 is opened so as to become an inspection hole 53.

Figure 5:
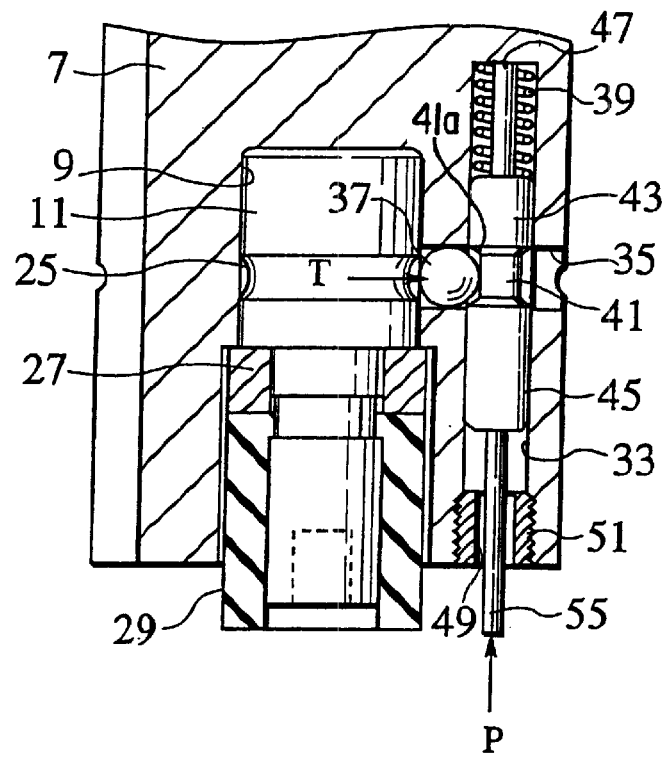
FIG. 5 is a drawing for explaining an operation.
Figure 6:
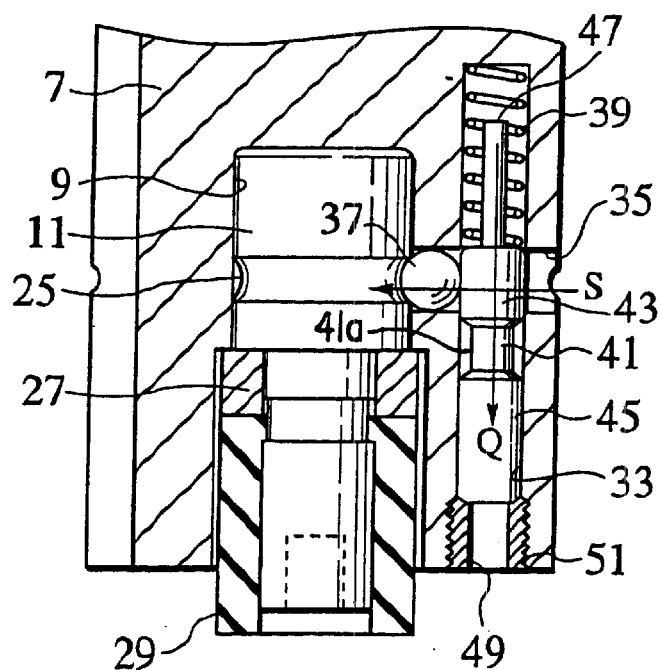
FIG. 6 is a drawing for explaining an operation.

According to the above structure, FIG. 3 shows the state before the punch chip is mounted, FIG. 5 shows the state that the punch chip is being mounted, and FIG. 6 shows the state that the mounting of the punch chip is completed. In the case where the punch chip 11 is mounted into the punch mounting hole 9 of the punch holder 7, as shown in FIG. 5, when an operator holds a bar 55 and inserts the bar 55 into the hole 49 and pushes the pin 45 upward (a direction of an arrow P). As a result, the pin 45 moves upward against an applied force of the spring 39, and the stopper section 47 bumps against the forward end of the hole 33 so that the receiving allowable concave section 41 is moved to a position corresponding to the steel ball 37. For this reason, as represented by an arrow T, the steel ball 37 is relieved into the receiving allowable concave section (relief groove) 41 so that the punch chip 11 can be inserted into the punch mounting hole 9.

When the bar 55 is released after the punch chip 11 is inserted into the punch mounting hole 9, the pin 45 moves downward (a direction of an arrow Q) by means of the applied force of the spring 39, and the steel ball 37 is pushed by the engagement piece pushing-out holding section 43 as represented by an arrow S in FIG. 6. As a result, the punch chip 11 is fitted into the R-shaped groove 25 so that the mounting is completed.

In the case where the punch chip 11 is removed from the punch mounting hole 9, when the bar 55 is inserted into the hole 49 of the set screw 51 and the pin 45 is pushed, the pin 45 moves upward against the applied force of the spring 39 so that the engagement piece pushing-out holding section 43 is removed from the steel ball 37. In this state, the punch chip 11 is pulled downward so that the punch chip 11 comes out of the punch mounting hole 9.

In such a manner, the punch chip 11 can be easily mounted to and removed from the punch mounting hole 9 of the punch holder 7 with one step.

Since the punch holder 7 has the hole 33, namely, the inspection hole 53, the state of the steel ball 37 can be easily checked from the inspection hole 53. Moreover, since the stopper section 47 is provided to the forward end of the pin 45, the stopper section 47 bumps against the forward end of the hole 33 and stops so that the steel ball 37 can be allowed to come into the receiving allowable concave section 41 automatically.

Here, the present invention is not limited to the above-mentioned embodiment, so the present invention can be practiced in another form by suitable modification.

The entire contents of Japanese Patent Application P10-220780 (filed Aug. 4, 1998) are incorporated herein by reference.

Although the invention has been described above by reference to certain embodiments of the invention, the invention is not limited to the embodiments described above. Modifications and variations of the embodiments descried above will occur to those skilled in the art, in light of the above teachings. The scope of the invention is defined with reference to the following claims.

What is claimed is:

1. A punch holder apparatus (1), for holding a punch chip (11), the holder apparatus (1) comprising:

a punch holder (7) including a punch mounting hole (9) extending in a longitudinal direction of the punch holder, the punch holder comprising an inspection hole (35) extending in a direction perpendicular to the longitudinal direction of the punch holder, the inspection hole (35) being opened from an inner circumferential surface of the punch mounting hole (9) toward an out side of the punch holder (7) thereby enabling to see the inner surface of the punch mounting hole (9) of the punch holder through the inspection hole (35) from the out side of the punch holder (7);

an engagement piece (37) to be mounted in the inspection hole (9), the engagement piece being movable in the inspection hole to the inner circumferential surface of the punch mounting hole (9), the engagement piece (37) being spherical in shape so as to engage in a groove (25) in a periphery of the punch chip (11) which is inserted into the punch mounting hole (9);

a lock piece (45) including a receiving allowable concave section (41) which has a smaller radius than a radius of the lock piece thereby forming a circumferential recess (41a) surrounding a peripheral portion of the receiving allowable concave section (41), the lock piece (45) being movable in a direction parallel to the longitudinal direction of the punch holder (7), the circumferential recess (41a) receiving the engagement piece (37) which is movable in the direction perpendicular to the longitudinal direction of the punch holder (7) in a first position where the receiving allowable concave section (41) and the circumferential recess (41a) are located at a height of the inspection hole (35) in the longitudinal direction of the punch holder (7) to receive the engagement piece (37) into the circumferential recess (41a), the lock piece (45) further including an engagement piece pushing-out holding section (43) at a top end of the receiving allowable concave section (41) which has the same radius as the radius of the lock piece (45); and a device (39) pressing the lock piece (45) so that the engagement piece pushing-out holding section (43) is normally located in a second position where the engagement piece pushing-out holding section (43) is located at a height of the inspection hole (35) in the longitudinal direction of the punch holder (7) to push the engagement piece (37) toward the groove (25) in the periphery of the punch chip (11), wherein the location of the lock piece (45) is capable to be inspected from the out side of the punch holder (7) through the inspection hole (35) in the direction perpendicular to the longitudinal direction of the punch holder (7) whether the lock piece (45) is located in the first position or the lock piece is located in the second position in the direction parallel to the longitudinal direction of the punch holder (7).

2. The punch holder apparatus (1) according to claim 1, wherein the lock piece (45) includes a stopper (47) at a top end of the engagement piece pushing pushing-out holding section (43); and wherein the stopper (47) is provided in a manner such that when the lock piece (45) is upwardly pushed, the stopper (47) stops the lock piece (45) at the first position, thereby enabling the lock piece (45) always to stop in a constant position where the engagement piece (37) is automatically fitted into the circumferential recess (41a) surrounding the peripheral portion of the receiving allowable concave section (41) of the lock piece 45.

* * * * *